(12) United States Patent
Winkler et al.

(10) Patent No.: US 8,969,183 B2
(45) Date of Patent: Mar. 3, 2015

(54) METHOD FOR PRODUCING THIN LAYERS OF CRYSTALLINE OR POLYCRYSTALLINE MATERIALS

(71) Applicant: Massachusetts Institute of Technology, Cambridge, MA (US)

(72) Inventors: Mark T. Winkler, Brooklyn, NY (US); Tonio Buonassisi, Cambridge, MA (US); Riley E. Brandt, Simsbury, CT (US); Michael J. Aziz, Concord, MA (US); Austin Joseph Akey, Boston, MA (US)

(73) Assignees: President and Fellows of Harvard College, Cambridge, MA (US); Massachusetts Institute of Technology, Cambridge, MA (US)

(*) Notice: Subject to any disclaimer, the term of this patent is extended or adjusted under 35 U.S.C. 154(b) by 315 days.

(21) Appl. No.: 13/660,213

(22) Filed: Oct. 25, 2012

(65) Prior Publication Data

US 2013/0288463 A1  Oct. 31, 2013

Related U.S. Application Data

(60) Provisional application No. 61/552,480, filed on Oct. 28, 2011.

(51) Int. Cl.
*H01L 21/20* (2006.01)
*H01L 21/36* (2006.01)
*C23C 16/24* (2006.01)
(Continued)

(52) U.S. Cl.
CPC .......... *H01L 21/02686* (2013.01); *C23C 16/01* (2013.01); *C23C 16/02* (2013.01); *C23C 16/24* (2013.01); *H01L 21/76259* (2013.01); *H01L 31/03682* (2013.01); *H01L 31/075* (2013.01); *H01L 31/1872* (2013.01);
(Continued)

(58) Field of Classification Search
USPC .......... 438/486, 487, 488, 489; 257/E21.002, 257/E21.211, E21.219, E21.502
See application file for complete search history.

(56) References Cited

U.S. PATENT DOCUMENTS

| 5,674,758 | A * | 10/1997 | McCarthy | 438/26 |
| 6,969,664 | B2 * | 11/2005 | D'Arrigo et al. | 438/424 |
| 2008/0289684 | A1 | 11/2008 | Moslehi | |

OTHER PUBLICATIONS

J. Kittl, P. Sanders, M.J. Aziz, D. Brunco, M. Thompson, Acta Materialia 48/20 (2000) 4797.

(Continued)

*Primary Examiner* — Mohsen Ahmadi
(74) *Attorney, Agent, or Firm* — Sam Pasternack; MIT Technology Licensing Office

(57) ABSTRACT

Method for making thin crystalline or polycrystalline layers. The method includes electrochemically etching a crystalline silicon template to form a porous double layer thereon, the double layer including a highly porous deeper layer and a less porous shallower layer. The shallower layer is irradiated with a short laser pulse selected to recrystallize the shallower layer resulting in a crystalline layer. Silicon is deposited on the recrystallized shallower layer and the silicon is irradiated with a short laser pulse selected to crystalize the silicon leaving a layer of crystallized silicon on the template. Thereafter, the layer of crystallized silicon is separated from the template. The process of the invention can be used to make optoelectronic devices.

6 Claims, 7 Drawing Sheets

(51) Int. Cl.
  *H01L 21/02* (2006.01)
  *C23C 16/01* (2006.01)
  *C23C 16/02* (2006.01)
  *H01L 21/762* (2006.01)
  *H01L 31/0368* (2006.01)
  *H01L 31/075* (2012.01)
  *H01L 31/18* (2006.01)

(52) U.S. Cl.
  CPC .......... *H01L 31/1896* (2013.01); *Y02E 10/546* (2013.01); *Y02E 10/548* (2013.01)
  USPC .......... 438/486; 438/487; 438/488; 438/489; 257/E21.002; 257/E21.211; 257/E21.219; 257/E21.502

(56) References Cited

OTHER PUBLICATIONS

R. Reitano, P. Smith, M.J. Aziz, Journal of Applied Physics 76/3 (1994) 1518.
M.J. Aziz, Acta metallurgica (1988).
M.J. Aziz, C. White, Physical Review Letters 57/21 (1986) 2675.
D.M. Powell, M.T. Winkler, H.J. Choi, C.B. Simmons, D. Berney Needleman and T. Buonassisi, Energy Environ. Sci. 5, 5874 (2012).
R. Brendel, H. Artmann, S. Oelting, W. Frey, J. Werner, H. Queisser, Applied Physics A 67/2 (1998) 151.
C. White, J. Narayan, R. Young, Science 204/4392 (1979) 461.
M. Alonsogarcia, J. Ruiz, F. Chenlo, Solar Energy Materials and Solar Cells 90/3 (2006) 329.
J. Pijpers, M. Winkler, Y. Surendranath, T. Buonassisi, D. Nocera, Proceedings of the National Academy of Science 108 (2011) 1.
E. Yablonovitch, Journal of the Optical Society of America 72/7 (1982) 899.
International Search report and Written Opinion issued in Connection with International Patent Application No. PCT/US2012/062064 mailed on Jan. 21, 2013.
Brendel R et al: "Textured 1-14 monocrystalline thin-film Si cells from the porous silicon (PSI) process" Progress in Photovoltaics: Research and Applications Wiley UK, vol. 9, No. 3, May 2001, pp. 217-221, XP002689724, ISSN: 1062-7995 p. 218, line 1-line 20.

\* cited by examiner

METHOD FOR PRODUCING THIN LAYERS OF CRYSTALLINE OR POLYCRYSTALLINE MATERIALS

This application claims priority to U.S. provisional application Ser. No. 61/552,480 filed on Oct. 28, 2011, the contents of which are incorporated herein by reference.

BACKGROUND OF THE INVENTION

This invention relates to a method for creating thin, crystalline or polycrystalline layers of a material such as silicon, and more particularly to such a method that requires neither high temperature furnace cycles nor wire-sawing methods.

Thin layers of crystalline or polycrystalline silicon (<25 µm) are of tremendous technological interest for low-cost photovoltaics and other applications because silicon represents about 25% of total module cost [5]. Because the layers are thin, for these applications polycrystalline devices will also be possible. Standard wire-sawing, however, cannot achieve thicknesses this low and is very wasteful, with about half of the initially grown material lost to "saw dust" or "kerf" (a fraction that grows as thinner wafers are achieved). Economic routes to thin crystalline Si layers would have significant impact.

The dominant existing technologies for silicon wafer production include the Czochralski and Float Zone processes. In both of these manufacturing techniques, a silicon ingot is produced from a molten silicon source through a crystallization process. Subsequently, the ingots are sliced into wafers of varying diameters and thicknesses. During the slicing process, a large fraction of the as-grown material is lost as waste (known as "kerf"). In addition, wire-sawn wafers are currently limited to thicknesses of about 80-100 µm for reasons of breakage and mechanical stability. Although thinner wafers may be possible with wire-sawing in the future, the diameter of the wires is also about >100 µm as well. Because a thickness of material equal to the wire diameter is lost as kerf, thinner wafers incur larger relative losses. Because the lost material is highly purified crystalline silicon, this represents a large component of the embedded cost.

Alternative methods exist for growing crystalline silicon that avoid wire sawing, and are referred to generally as "kerfless" techniques. For example, the string ribbon and edge-defined growth techniques both pull crystalline silicon wafers directly from the melt. However, wafers grown in these techniques are thermally intensive and cannot achieve layer thicknesses much below 100 µm.

Finally, an existing perforated/porous silicon process utilizes a double-porous layer and mechanical exfoliation. However, it utilizes a high temperature process (~1400 K) to achieve recrystallization and high-temperature epitaxial CVD growth. This decreases throughput and increases the energy intensity and cost of the process. Although it can, in principle, achieve comparably thin layers, the minimum useful device thickness will be limited by the thermal diffusion of dopants during high temperature epitaxial CVD growth.

It is therefore an object of the invention to provide a method for making thin, crystalline or polycrystalline silicon that reduces the amount of silicon wasted during prior art sawing processes. Further, it is an object to provide a method that enables layer thicknesses much thinner than possible using wire sawing methods. Yet another object of the invention is to realize desirable photovoltaic architectures including homojunction devices, monolithically integrated, all-silicon multi-junction cells, and other silicon-based devices for electricity production or photoelectroloysis.

It is a further object of the invention to directly realize thin (<1-100 µm) layers of crystalline silicon that are monocrystalline or multicrystalline with large grain size and low defect concentration.

It is yet another object of the invention to minimize thermal processing by eliminating furnace cycles.

SUMMARY OF THE INVENTION

In one aspect, the invention is a method for making thin crystalline or polycrystalline silicon layers including electrochemically etching a crystalline silicon template to form a porous double layer thereon, the double layer including a highly porous deeper layer and a less porous shallower layer. The shallower porous layer is irradiated with a short laser pulse selected to recrystallize the shallower layer resulting in a crystalline or polycrystalline layer. A layer of silicon, which need not be crystalline and preferably is amorphous is deposited on the recrystallized shallower layer and this silicon layer is irradiated with a short laser pulse selected to crystalize the silicon leaving a layer of crystalized silicon on the template. The process may be repeated multiple times to build up thicker layers. This layer of crystalized silicon is subsequently separated from the template.

In a preferred embodiment the silicon template is doped to be p- or n-type. It is suitable for the laser pulse to have a duration in the range of 0.1-100 ns. The depositing step may be selected from the group consisting of sputtering, chemical vapor deposition, thermal evaporation and condensation, and electron beam evaporation and condensation.

In a preferred embodiment, the layer of crystalized silicon has a thickness in the range of about 0.1-10 µm. The separating step preferably includes mechanically cracking the highly porous deeper layer.

The layer of crystalized silicon may be processed into an optoelectronic device. In another preferred embodiment, the deposited silicon includes dopants forming a homojunction device.

In yet another aspect, the invention is a method for making a homojunction device. The method includes electrochemically etching a crystalline silicon template to form a porous double layer thereon, the double layer including a highly porous deeper layer and a less porous shallower layer. The shallower layer is irradiated with a short laser pulse selected to recrystallize the shallower layer resulting in a crystalline or polycrystalline layer. Silicon along with a dopant is deposited on the recrystallized shallower layer and it is irradiated with a short laser pulse selected to crystallize the silicon leaving a layer of crystalized silicon including a dopant on the template. The grain size of the crystallized silicon may be in the range of 0.1-10 µm. The depositing step may be repeated with different dopants and the layer of crystallized doped silicon is then separated from the template.

DESCRIPTION OF THE PREFERRED EMBODIMENT

The present invention employs a combination of electrochemical and laser methods for the production of thin crystalline or polycrystalline silicon layers. The disclosed technique has a low thermal budget as compared to the prior art.

Figure 1:
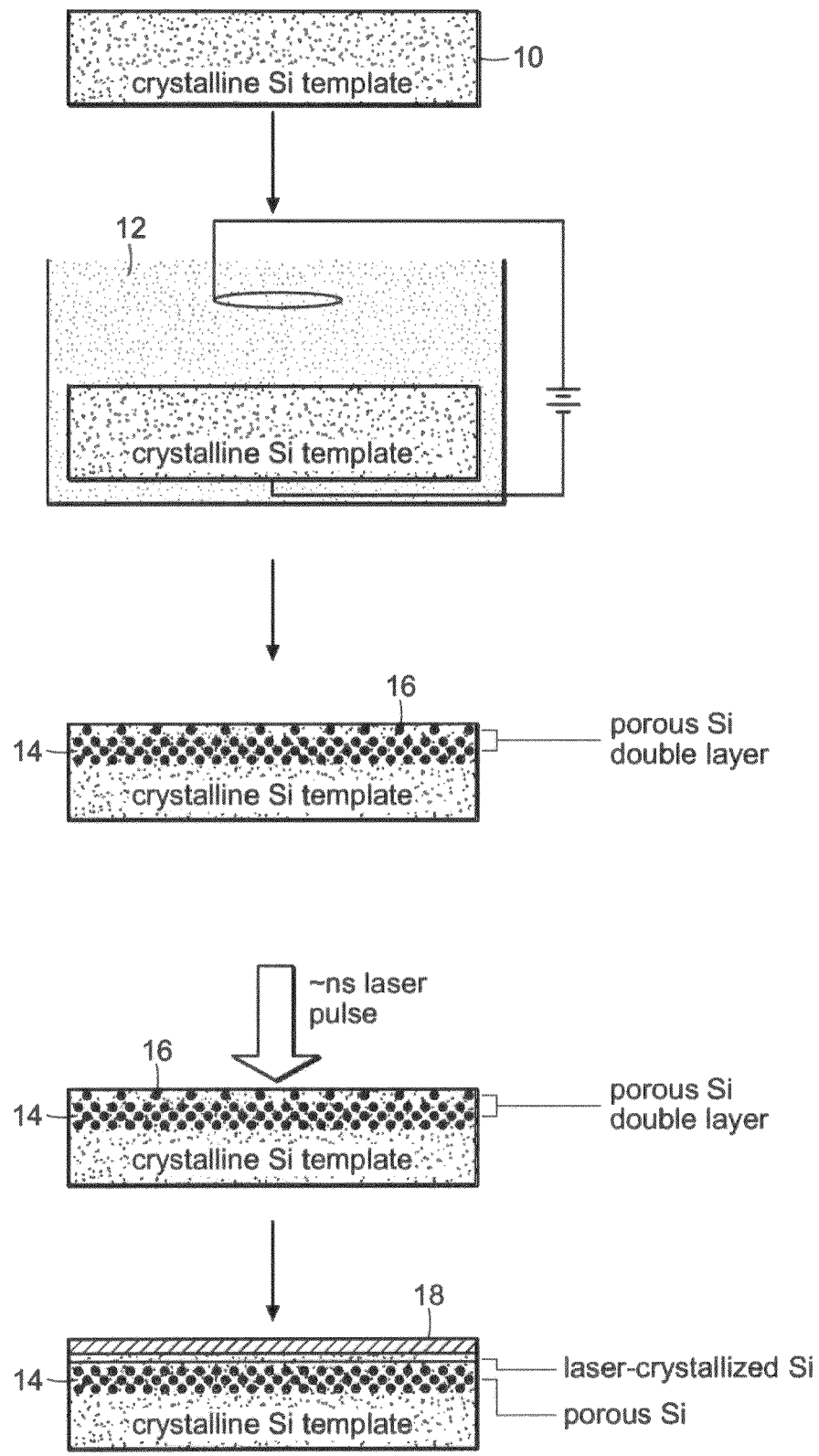
FIG. 1 is a schematic flow chart showing the steps of an embodiment of the invention disclosed herein.

With reference first to FIG. 1, a silicon substrate or wafer 10, herein referred to as the template 10, is used as a sacrificial material on which to create a thin film c-Si wafer. The template 10 may be textured, and may be doped p- or n-type to any resistivity. The template 10 is submerged in an acid etch bath 12 and is electrochemically etched to produce a double layer of porous silicon at the surface. The porous double layer includes a highly porous, deeper layer 14 below a less porous, shallower layer 16. The methods for producing the porous silicon layers have been outlined in the prior art and are known to those skilled in the art.

Once this porous double layer has been formed, the top layer 16, of lower porosity, is recrystallized into a monocrystalline or multicrystalline layer of doped silicon. This recrystallization is performed through a technique called pulsed laser annealing, in which short (duration between 0.1 and 100 ns), intense laser pulses are applied to the surface of the porous layer 16 to induce local heating and/or melting, and in doing so annealing a layer of pre-defined thickness. A single laser pulse may be used or multiple pulses may be appropriate as desired to improve recrystallization properties. It is preferred in one embodiment to perform the irradiation steps in a low pressure atmosphere or vacuum.

On the surface of the template 10 now remains a layer of highly porous silicon 14 with a thin (<5 micron) c-Si layer over top. This layer serves as a substrate for a rapid and low temperature deposition of Si (a-Si) to form a layer 18 of silicon, through any number of growth techniques, and potentially including sputtering, chemical vapor deposition, thermal evaporation and condensation, or electron beam evaporation and condensation. Doping and other film transport properties may be manipulated during this deposition phase.

This layer 18 is now recrystallized as before, through a pulsed laser melting process. This leaves a less thin layer of crystalline or polycrystalline Si on the surface of the template of about 1-10 μm in thickness, separated only by the thin highly porous layer 14. This deposition and anneal process may be subsequently repeated to generate thicker layers or more complex structures, utilizing a variety of doping profiles or layer constituents.

The final step involves the removal of the deposited thin film through a lift-off or exfoliation technique. Here, mechanical force is applied to induce cracking within the mechanically compromised porous layer 14, leaving the thin film layer 18 intact and separated from the template 10. Alternatively, other methods may be used to separate the recrystallized layer, for example, chemical etching. This template 10 may then be re-used in further deposition. In an alternative embodiment, the c-Si wafer is partially processed into a working optoelectronic device or solar cell while still attached to the template, so as to eliminate further processing steps once removed. The features of this processing and lift-off are outlined in the prior art and should be evident to those skilled in the art.

Figure 2:
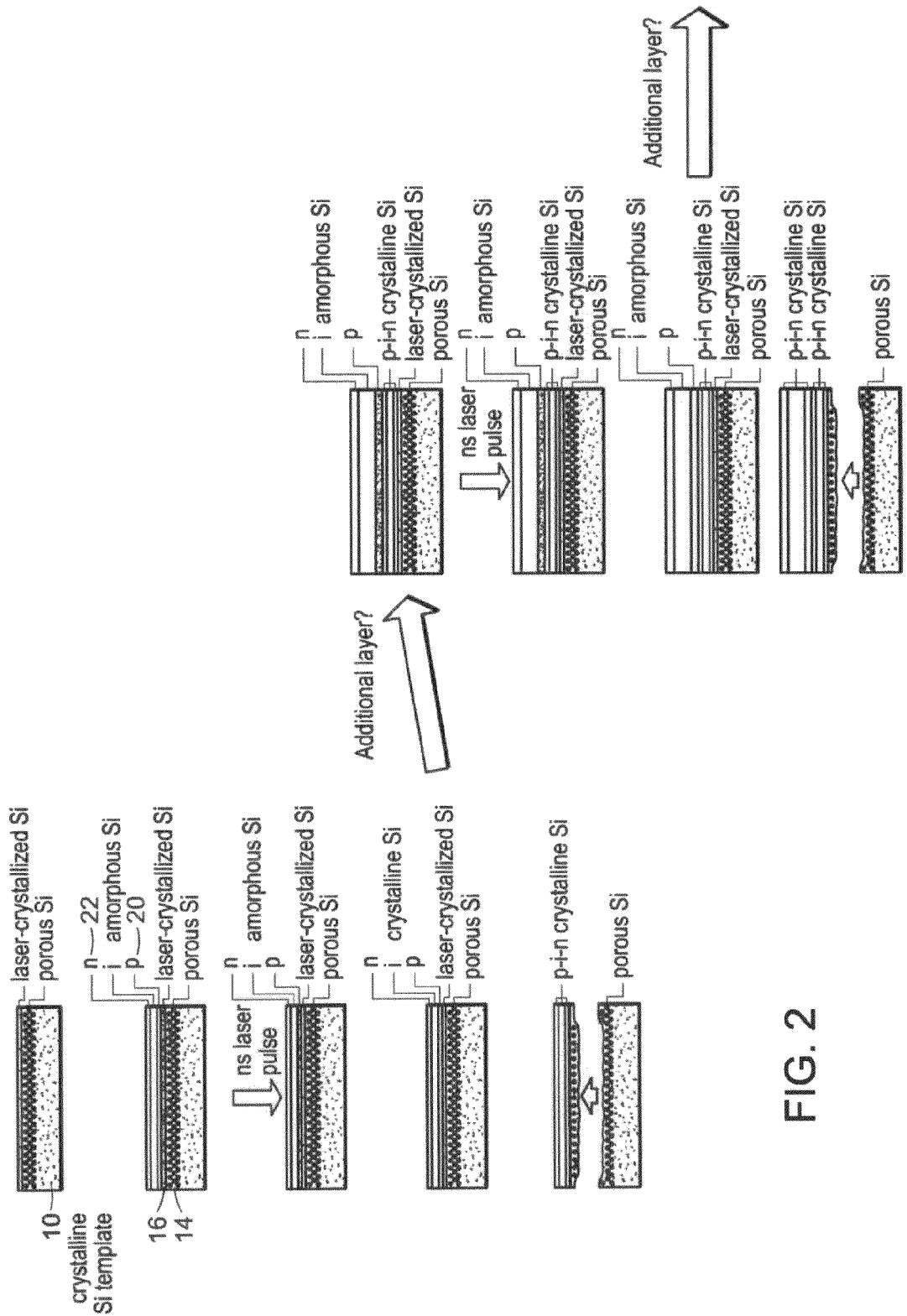
FIG. 2 is a schematic flow chart showing the formation of thin crystalline p-i-n solar cells.

The method described above may be used to make a single or multiple homojunction device. The steps in FIG. 1 are followed producing the crystalline seed layer atop the highly porous sub-layer 14 as shown in FIG. 2. Silicon is deposited (below, the deposition will be referred to as sputtering, although alternative deposition techniques could be used). Sputtering targets are chosen and employed such that electrically active species, referred to as dopants, are present in individual targets. Three targets could be selected, for example, such that one target contained mostly silicon with trace amounts (<1%) of a p-type dopant such as boron or gallium, one target contained pure silicon, and one contained mostly silicon with trace amounts (<1%) of an n-type dopant, such as phosphorous or arsenic. In this embodiment, a thin layer 20 of silicon containing the p-type dopant (~10 nm) could be deposited, followed by a thicker layer of pure silicon (~1 μm), followed by a thin layer 22 of silicon containing the n-type dopant (~10 nm). This stack of silicon could then be irradiated using a short laser pulse of about 10 ns, but in the range of 0.1 ns-100 ns, melting the silicon down to the c-Si seed layer. The molten stack would then resolidify epitaxially in a crystalline phase or multicrystalline phase with large grains, while the dopants would not redistribute significantly.

Thus the crystalline layer so-produced would embody a p-i-n solar cell device, forming a dual homojunction device. Alternatively, the i-layer could be omitted, thus forming a p-n single homojunction device. Alternatively, a sputtering target of only a single dopant type could be used, of an opposite type to the crystalline seed layer. Thus a single p-n homojunction could be formed using a single deposited layer. Metallization of the device could proceed in a number of ways, as could inclusion of antireflection coatings and other standard features of a silicon solar cell, as should be evident to those skilled in the art. The thickness of the p-doped, n-doped, and pure silicon could be varied over a large range to accommodate specific application needs. Either before or after metallization, the layer could be exfoliated as described above and shown schematically in FIG. 2 (left column).

Figure 3:
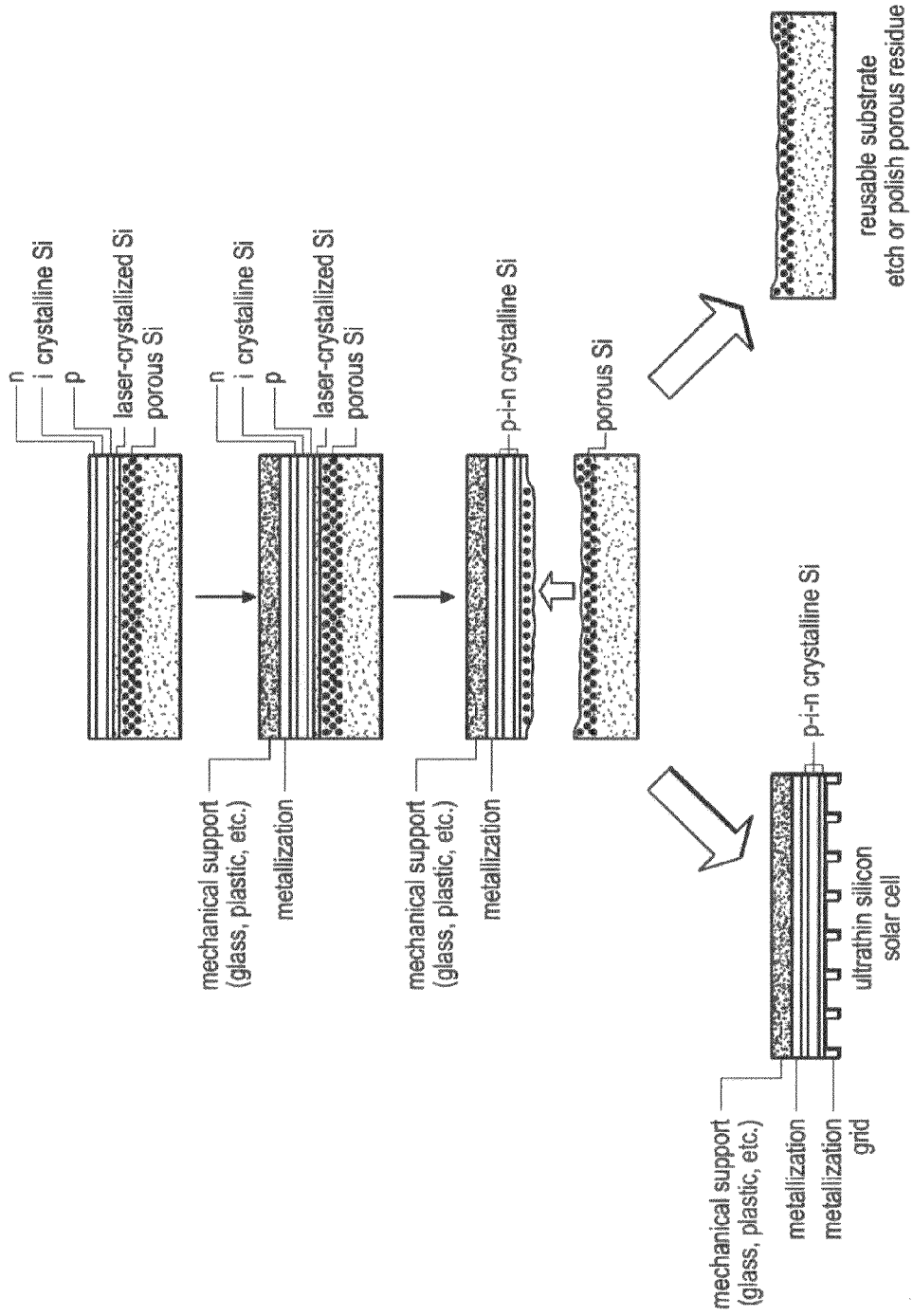
FIG. 3 is a flow chart of the process steps for a device structure using a p-i-n double homojunction implementation.

With reference to FIG. 3, we give an example of a double homojunction thin-crystalline silicon device. After forming the double homojunction as summarized in FIGS. 1 and 2, the top surface of the device is metallized and affixed to a mechanical support. The mechanical backing could be rigid (e.g., glass or rigid plastic) or flexible (metal foil or flexible plastic). The layer is exfoliated, and a front-side metallization applied. The substrate is recycled, with possible surface preparation needed (polishing, etc.) to remove any residual damage from the porous silicon layer.

Figure 4A:
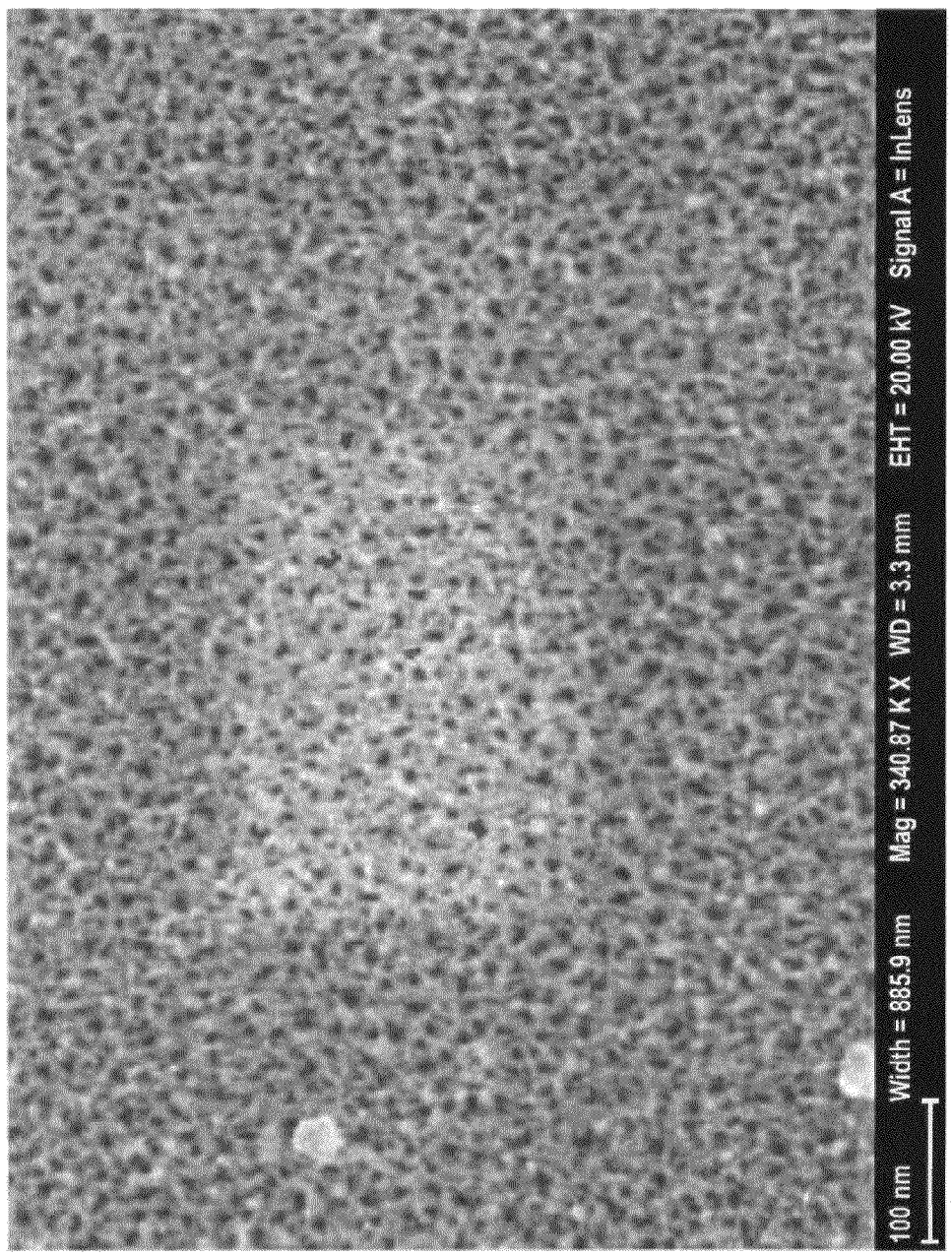
FIGS. 4A and 4B are micrographs showing a porous layer as grown before laser irradiation (4A) and after laser irradiation (4B).
Figure 4B:
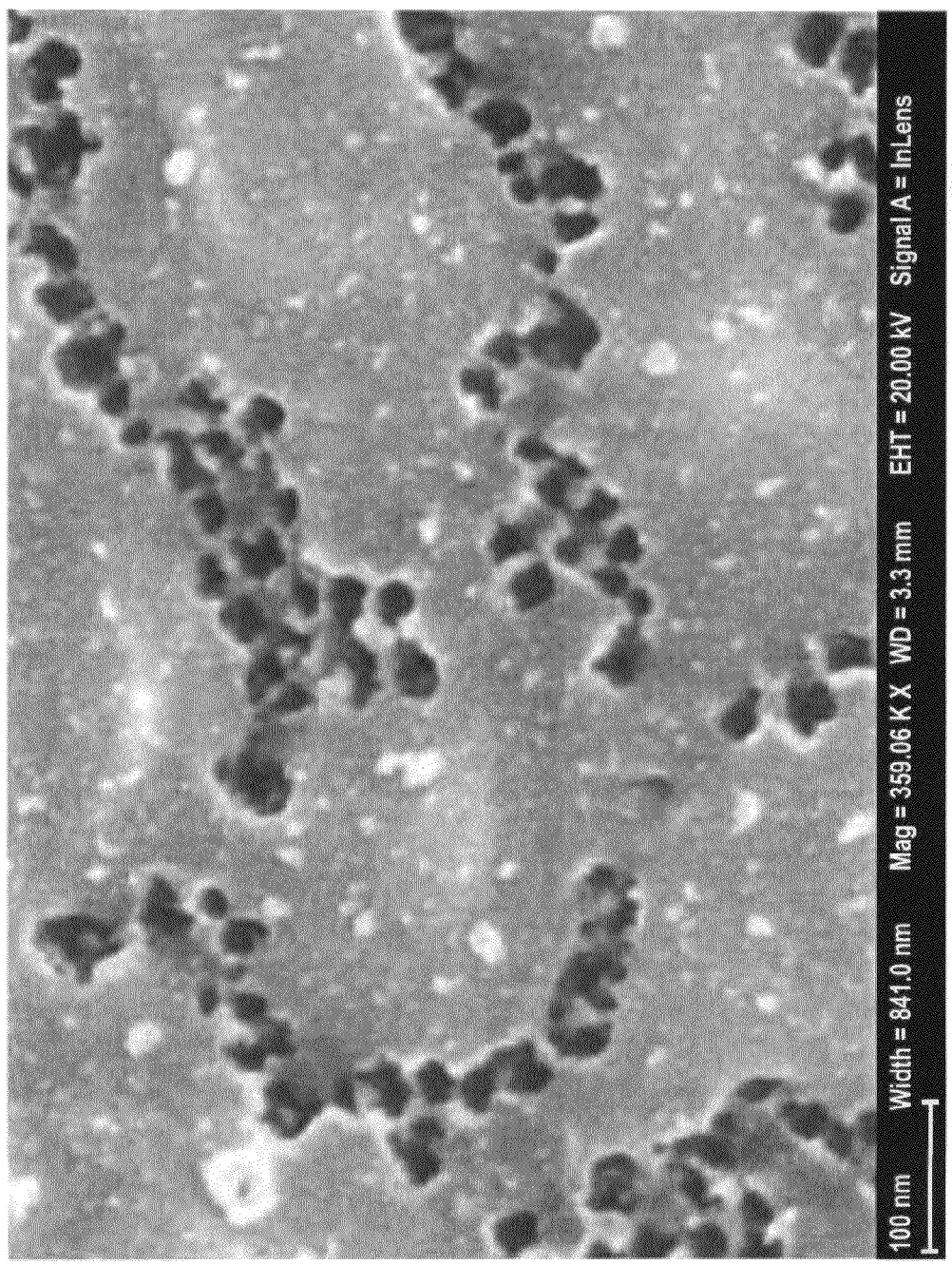
Figure 5A:
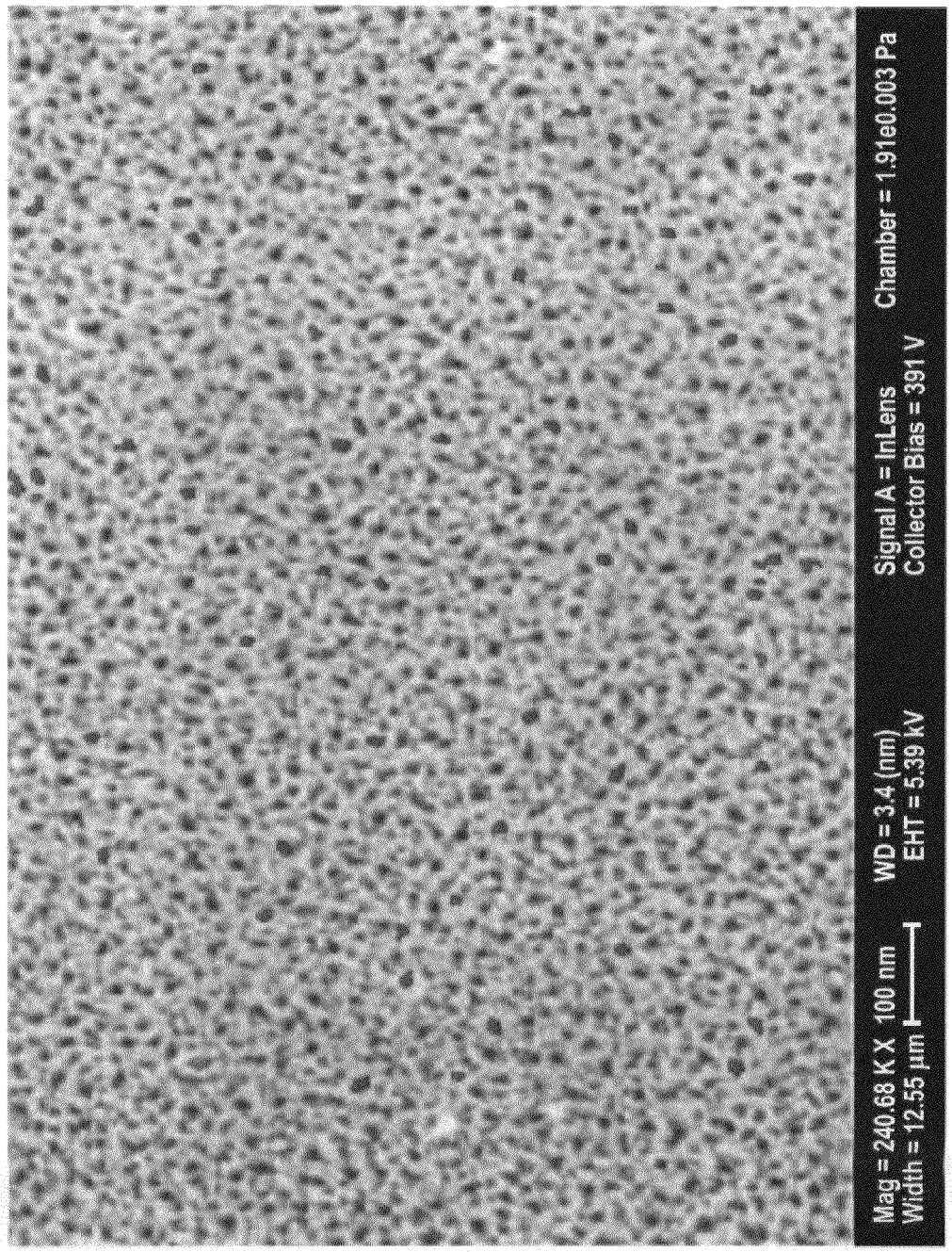
FIGS. 5A and 5B are micrographs showing a porous layer as grown before laser irradiation (5A) and after laser irradiation (5B).
Figure 5B:
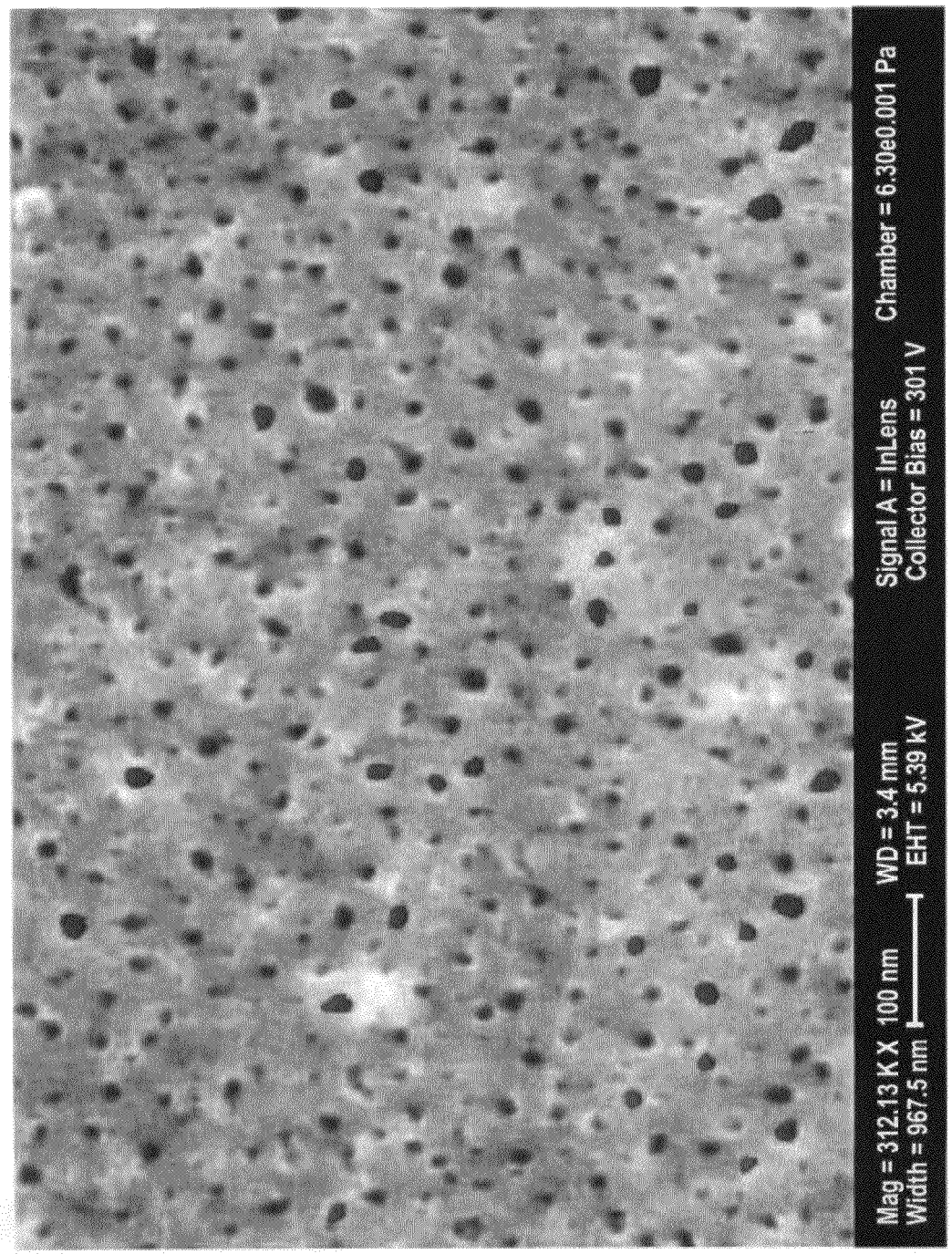

Experiments have been conducted in accordance with the invention. Results are shown in FIGS. 4A, 4B, 5A and 5B. FIGS. 4A and 5A show porous layers as grown. FIGS. 4B and 5B show that laser irradiation can close pores. In FIG. 4B one can see that the majority of the area is recrystallized with large connected grains. The structure in FIG. 5B retains more voids but is more homogeneous that that of FIG. 4B.

The method disclosed herein may be used to make a tunable voltage device. In this implementation, the implementation described above would be pursued. However, after formation of the first p-i-n or p-n homojunction device, additional layers of silicon would be deposited in a similar manner as described. Laser irradiation would occur after all silicon layers had been deposited or, if the total device thickness exceeded the maximum melting depth of the laser, laser irradiation would occur in stages, perhaps after the layers needed for each individual device were deposited. In this manner, laser melting would yield a continuous epitaxial stack of silicon devices. The thickness of the layers could be designed such that, for the eventual solar cell device, each homojunction device absorbs an equal or approximately equal number of photons from the incident light source. In this way, an equal current would be generated in each layer, a situation required for efficient operation of several solar cells in series and referred to as "current-matching". Each p-n or p-i-n structure that was deposited would increase the voltage output of the final device, in increments of about 0.5 V, but potentially in the range of 0.1-0.7 V. As described above, metallization and exfoliation could occur in a fashion best suited for the eventual device.

The present invention can also be used to make a device for splitting water into hydrogen and oxygen. In this implementation, the device outlined above would be implemented with an electrochemical cell and an appropriate catalyst for splitting water. Because the thermodynamic potential required for splitting a water molecule exceeds the voltage output of a single silicon homojunction device, only a number of cells in series can produce the necessary voltage (for example, 3 cells or 4 cells in series). However, by producing a cell that contains these serially connected cells in a single footprint subsequent device processing would be simplified.

Other layers or materials could be implemented into the process of the invention. For example, the template could be formed from materials other than silicon, especially materials for which a pore-forming process is known. In particular, materials grown using Czochralski or float zone growth methods (the same relatively expensive processes used to grow crystalline silicon) would be attractive candidates, for example: Ge and GaAs. Otherwise all procedures would be identical, and all of the advantages of this technique would be maintained. In addition, layers other that p-type, n-type, and pure silicon could be incorporated: for example: SiGe alloys or amorphous silicon layers that remained uncrystalized. Other applications of the invention disclosed herein include flexible electronics and displays.

The present invention provides a number of clear advantages over prior art processes. The invention allows for the making of thin silicon layers by a process that is inexpensive, quick and of lower energy consumption than prior art techniques. The invention limits kerf loss and thus cost is limited. Those of ordinary skill in the art will recognize that it would be straightforward to form a production line around the process of the invention and the template is reused for increased efficiency. The invention also enables more diverse arrays of silicon feedstocks as well as more control over doping. The invention can still fit into existing cell and module supply chains. The process of the invention can also achieve much thinner effective device layers with minimum thicknesses below 100 nm, although device thicknesses of at least 5 µm are more likely.

The present invention replaces expensive and energy intensive growth from a melt with a room temperature sputtering (or similar) deposition process and pulsed laser irradiation. The invention achieves higher crystalline quality than with prior art techniques. Thus, the laser-based process disclosed herein can achieve superior performance, cost and throughput relative to any known competing technology.

It is recognized that modifications and variations of the invention will be apparent to those of ordinary skill in the art and it is intended that all such modifications and variations be included within the scope of the appended claims.

The references listed herein are incorporated into this application by reference.

REFERENCES

[1] J. Kittl, P. Sanders, M. J. Aziz, D. Brunco, M. Thompson, Acta Materialia 48/20 (2000) 4797.

[2] R. Reitano, P. Smith, M. J. Aziz, Journal Of Applied Physics 76/3 (1994) 1518.
[3] M. J. Aziz, Acta metallurgica (1998).
[4] M. J. Aziz, C. White, Physical Review Letters 57/21 (1986) 2675.
[5] D. M. Powell, M. T. Winkler, H. J. Choi, C. B. Simmons, D. Berney Needleman and T. Buonassisi, *Energy Environ. Sci.* 5, 5874 (2012).
[6] R. Brendel, H. Artmann, S. Oelting, W. Frey, J. Werner, H. Queisser, Applied Physics A 67/2 (1998) 151.
[7] C. White, J. Narayan, R. Young, Science 204/4392 (1979) 461.
[8] M. Alonsogarcia, J. Ruiz, F. Chenlo, Solar Energy Materials and Solar Cells 90/3 (2006) 329.
[9] J. Pijpers, M. Winkler, Y. Surendranath, T. Buonassisi, D. Nocera, Proceedings of the National Academy of Science 108 (2011) 1.
[10] E. Yablonovitch, Journal of the Optical Society of America 72/7 (1982) 899.

What is claimed is:

1. A method for making thin crystalline or polycrystalline silicon layers comprising:
    electrochemically etching a crystalline silicon template to form a porous double layer thereon, the double layer including a highly porous deeper layer and a less porous shallower layer;
    irradiating the shallower layer with a short laser pulse selected to recrystallize the shallower layer resulting in a crystalline or polycrystalline layer;
    depositing silicon on the recrystallized shallower layer;
    irradiating the silicon with a short laser pulse selected to crystallize the silicon leaving a layer of crystallized silicon on the template; and
    separating the layer of crystallized silicon from the template;
    wherein the layer of crystallized silicon has a thickness in the range of about 0.1-10 µm;
    wherein the separating step comprises mechanically cracking the highly porous deeper layer.

2. The method of claim 1 wherein the silicon template is doped to be p- or n-type.

3. The method of claim 1 wherein the laser pulse has a duration in the range of 0.1-100 ns.

4. The method of claim 1 wherein the depositing step is selected from the group consisting of sputtering, chemical vapor deposition, thermal evaporation and condensation, electron beam evaporation and condensation.

5. A method for making a homojunction device comprising:
    electrochemically etching a crystalline silicon template to form a porous double layer thereon, the double layer including a highly porous deeper layer and a less porous shallower layer;
    irradiating the shallower layer with a short laser pulse selected to recrystallize the shallower layer resulting in a crystalline or polycrystalline layer;
    depositing silicon along with a dopant on the recrystallized shallower layer;
    irradiating the doped silicon with a short laser pulse selected to recrystallize the doped silicon leaving a layer of crystallized doped silicon on the substrate;
    repeating the depositing step with different dopants; and
    separating the layer of crystallized silicon from the template,
    wherein the crystalline or polycrystalline layer has a grain size in the range of 0.1-100 µm, wherein the crystalline or polycrystalline layer has a grain size of about 10 μm, wherein the irradiating steps are performed in a low pressure atmosphere or vacuum.

6. The method of claim 1 wherein the depositing step deposits amorphous or polycrystalline silicon.

* * * * *